United States Patent
Schnabel et al.

(10) Patent No.: US 7,136,320 B2
(45) Date of Patent: Nov. 14, 2006

(54) METHOD AND REGULATING CIRCUIT FOR REFRESHING DYNAMIC MEMORY CELLS

(75) Inventors: Joachim Schnabel, München (DE); Michael Hausmann, Graz (AT)

(73) Assignee: Infineon Technologies AG, Munich (DE)

( * ) Notice: Subject to any disclaimer, the term of this patent is extended or adjusted under 35 U.S.C. 154(b) by 144 days.

(21) Appl. No.: 10/761,127

(22) Filed: Jan. 20, 2004

(65) Prior Publication Data

US 2004/0208074 A1    Oct. 21, 2004

(30) Foreign Application Priority Data

Jan. 22, 2003    (DE)    ............... 103 02 292

(51) Int. Cl.
*G11C 7/00*    (2006.01)
(52) U.S. Cl. .................. 365/222; 365/204; 365/185.24
(58) Field of Classification Search ................ 365/222, 365/204, 210, 185.25, 185.24
See application file for complete search history.

(56) References Cited

U.S. PATENT DOCUMENTS

| | | | | |
|---|---|---|---|---|
| 5,680,359 A | * | 10/1997 | Jeong | ......................... 708/620 |
| 5,889,719 A | * | 3/1999 | Yoo et al. | .................... 365/226 |
| 5,977,836 A | * | 11/1999 | Swan et al. | .................. 331/1 A |
| 6,252,816 B1 | * | 6/2001 | Mullarkey | .................... 365/222 |
| 6,269,039 B1 | | 7/2001 | Glossner, III et al. | |
| 6,483,764 B1 | * | 11/2002 | Chen Hsu et al. | .......... 365/222 |
| 6,603,696 B1 | * | 8/2003 | Janzen | ....................... 365/222 |
| 6,618,310 B1 | * | 9/2003 | Higashiho et al. | .......... 365/222 |
| 6,714,473 B1 | * | 3/2004 | Fiscus | ........................ 365/222 |
| 6,891,404 B1 | * | 5/2005 | Le et al. | ....................... 327/48 |

FOREIGN PATENT DOCUMENTS

DE    44 24 952    3/1995

OTHER PUBLICATIONS

German Examination Report dated Jul, 4, 2003.

* cited by examiner

*Primary Examiner*—Richard Elms
*Assistant Examiner*—Dang Nguyen
(74) *Attorney, Agent, or Firm*—Patterson & Sheridan, L.L.P.

(57) ABSTRACT

A method and circuit for refreshing dynamic memory cells arranged along word lines and bit lines are provided, the memory cells being refreshed in a manner dependent on a refresh signal with a refresh frequency by the activation of the word line in order to write the information back to the memory cells arranged on the relevant word line, in which case the refresh frequency is set in a manner dependent on the charge loss of first dummy memory cells during a refresh period of the refresh signal on a first dummy word line and/or in a manner dependent on the charge loss of second dummy memory cells during the refresh period of the refresh signal on a second dummy word line.

19 Claims, 2 Drawing Sheets

METHOD AND REGULATING CIRCUIT FOR REFRESHING DYNAMIC MEMORY CELLS

CROSS-REFERENCE TO RELATED APPLICATIONS

This application claims foreign priority benefits under 35 U.S.C. §119 to co-pending German patent application number 103 02 292.9-53, filed Jan. 22, 2003. This related patent application is herein incorporated by reference in its entirety.

BACKGROUND OF THE INVENTION

1. Field of the Invention

The invention relates to a method for refreshing dynamic memory cells, and to a regulating circuit for regulating the repetition rate of the refresh operation of dynamic memory cells.

2. Description of the Related Art

Memory cells of a dynamic memory circuit store information in the form of charges in capacitors which are constructed in integrated form in a semiconductor circuit. The capacitors lose their charge through leakage currents, as a result of which the information is lost after a data retention time. The data retention time is the maximum time after which the content of a memory cell can still be read out correctly.

In order to store the information items permanently, the dynamic memory cells therefore have to be refreshed at regular intervals with a refresh frequency, i.e. have the information stored therein written to them anew, so that the information is not lost.

The period duration of the refresh frequency with which the memory cell has to be refreshed depends to a considerable extent on the operating temperature and the quality of the production process. This is because both factors influence the data retention time.

In the so-called self-refresh mode of a DRAM, the memory cells are automatically refreshed without external control signals by means of internal logic. In this case, it is desirable for the current consumption of the DRAM to be minimal. One essential measure for achieving this is to make the time interval between the individual refresh cycles as large as possible, without losing data.

SUMMARY OF THE INVENTION

A first aspect of the present invention provides a method for refreshing dynamic memory cells arranged along word lines and bit lines. The memory cells are refreshed in a manner dependent on a refresh signal with a refresh frequency by the activation of the word line in order to write the respective information back to the memory cells arranged on the relevant word line. According to the invention, the refresh frequency is set in a manner dependent on the charge loss of first dummy memory cells, arranged on a first dummy word line, during a refresh period of the refresh signal and/or in a manner dependent on the charge loss of second dummy memory cells, arranged on a second dummy word line, during the refresh period of the refresh signal.

The method according to the invention has the advantage that the refresh frequency of the refresh signal can be set in a manner dependent on the leakage currents through which the charge information flows away from the memory cells. In this way, it is possible to individually set the refresh frequency in each memory module such that the refresh frequency precisely suffices to reliably retain the information items in the memory cells, and that at the same time the current consumption is as low as possible. This is achieved by the refresh frequency being chosen in a manner dependent on the average charge losses of first and/or second dummy memory cells during a refresh period. If the production process of the memory circuit causes low leakage currents through which the charges flow from or to the memory cells, then the refresh frequency can be reduced and the current consumption of the memory circuit can thus be minimized. If high leakage currents flow on account of the production process in the memory circuit, then the refresh frequency is increased until the information items can be reliably retained in the memory cells. In this way, it is possible to ensure that, depending on the operating temperature and/or on the leakage currents resulting on account of diverse parameters of the production process, the refresh frequency of each memory circuit is chosen precisely such that a lowest possible current consumption is achieved.

By virtue of the fact that a plurality of first or second dummy memory cells are arranged on a word line, differences with regard to the leakage currents and the charge storage capacitance between the dummy memory cells are essentially averaged out over a relatively large chip area, so that the refresh frequency is oriented to a leakage current behavior of an average memory cell of the relevant memory circuit.

It may be provided that the refresh frequency is increased if the charge loss of the first dummy memory cells is greater than a specific first charge magnitude or if the charge loss of the second dummy memory cells is greater than a specific second charge magnitude. In this way, a maximum permissible charge loss can be prescribed by prescribing a specific first or second charge magnitude. If the charge loss of the memory cells exceeds the specific first or second charge magnitude, then the refresh frequency has to be increased again.

It may preferably be provided that, in order to determine whether the charge loss of the first and/or of the second dummy memory cells is greater than a specific first and/or second charge magnitude, firstly the dummy memory cells are charged to a voltage potential. Afterward, the corresponding word line is deactivated in order to isolate the dummy memory cells from a common bit line. The common bit line may then be charged to a center potential. Afterward, the word line is activated after the time duration of a refresh period in order to connect the dummy memory cells to the common bit line. The potential on the bit line after the connection of the dummy memory cells is subsequently compared with a reference potential. The reference potential determines the specific first or second charge magnitude and, in the event of the voltage threshold prescribed by the reference potential being exceeded or undershot, indicates whether the charge loss is greater than the specific first or second charge magnitude.

The refresh frequency is preferably formed by dividing down a fundamental frequency in accordance with an adjustable frequency divider. This has the advantage that different refresh frequencies can be provided in a simple manner.

It is preferably provided that the divider factor of the frequency divider is increased incrementally, i.e. by a predetermined value, if the charge loss of the first dummy memory cell is greater than the first charge magnitude or if the charge loss of the second dummy memory cells is greater than the second charge magnitude.

Equally, it is preferably provided that a divider factor of the frequency divider is reduced incrementally, i.e. by a predetermined value, if the charge loss of the first dummy memory cells is less than the first charge magnitude or if the charge loss of the second dummy memory cells is less than the second charge magnitude. In this way, it is possible to provide a regulation which sets the divider factor for the frequency divider such that the refresh frequency is chosen in the region of the optimum refresh frequency for the respective memory circuit. This is achieved in that a maximum permissible charge loss prescribed by a reference potential is prescribed and the refresh frequency is not reduced any further after the maximum permissible charge loss has been reached.

Preferably, the first and/or second charge magnitude is chosen such that, in the event of the corresponding charge magnitude being exceeded, the memory cells essentially retain their stored information items by virtue of the refreshing of the divider factor reduced by an increment. In this way, the maximum permissible charge loss is chosen such that no information is lost in the memory cells even in the event of the maximum permissible charge loss being exceeded, as a result of a reduction of the refresh frequency in accordance with a change in the divider factor by an increment.

A further aspect of the present invention provides a regulating circuit for setting the refresh frequency in a dynamic memory circuit having memory cells arranged along word lines and bit lines. A refresh circuit is provided in order to refresh the memory cells with a refresh signal with a refresh frequency. First dummy memory cells are arranged on a first word line and second dummy memory cells are arranged on a second word line. The first dummy memory cells can be connected to a first common bit line by activation of the first word line, and the second dummy memory cells can be connected to a second common bit line by activation of the second word line. A regulating unit is furthermore provided in order to prescribe the refresh frequency of the refresh signal, it being possible to set the refresh frequency in a manner dependent on a charge loss of the first dummy memory cells during a refresh period on the first dummy word line and/or in a manner dependent on the charge loss of the second dummy memory cells during the refresh period on the second dummy word line.

The regulating circuit according to the invention has the advantage that the refresh frequency in a dynamic memory circuit can be set as low as possible by the refresh frequency being altered in a manner dependent on the average leakage current behavior of the memory cells. This is carried out by providing dummy memory cells whose leakage current behavior is checked at the refresh frequency respectively set and the refresh frequency being set in a manner dependent on the charge loss in the dummy memory cells.

It may be provided that the regulating circuit has a control unit in order to provide activation signals for the first and second dummy word lines, so that the memory cells are connected to the respective common bit line in a manner dependent on the respective activation signal. The control unit furthermore makes a precharge signal available, which brings about a charging of the first common bit line to a first potential and a charging of the second common bit line to a second potential. The control unit may preferably carry out the activation of the respective dummy word line by the respective activation signal and the activation of the precharge signal after a respective refresh period, so that it is possible to determine the charge loss through leakage currents in the dummy memory cells during precisely one refresh period in each case.

BRIEF DESCRIPTION OF THE DRAWINGS

A preferred embodiment of the invention is explained in more detail below with reference to the accompanying drawings, in which.

DETAILED DESCRIPTION OF THE PREFERRED EMBODIMENT

Figure 1:
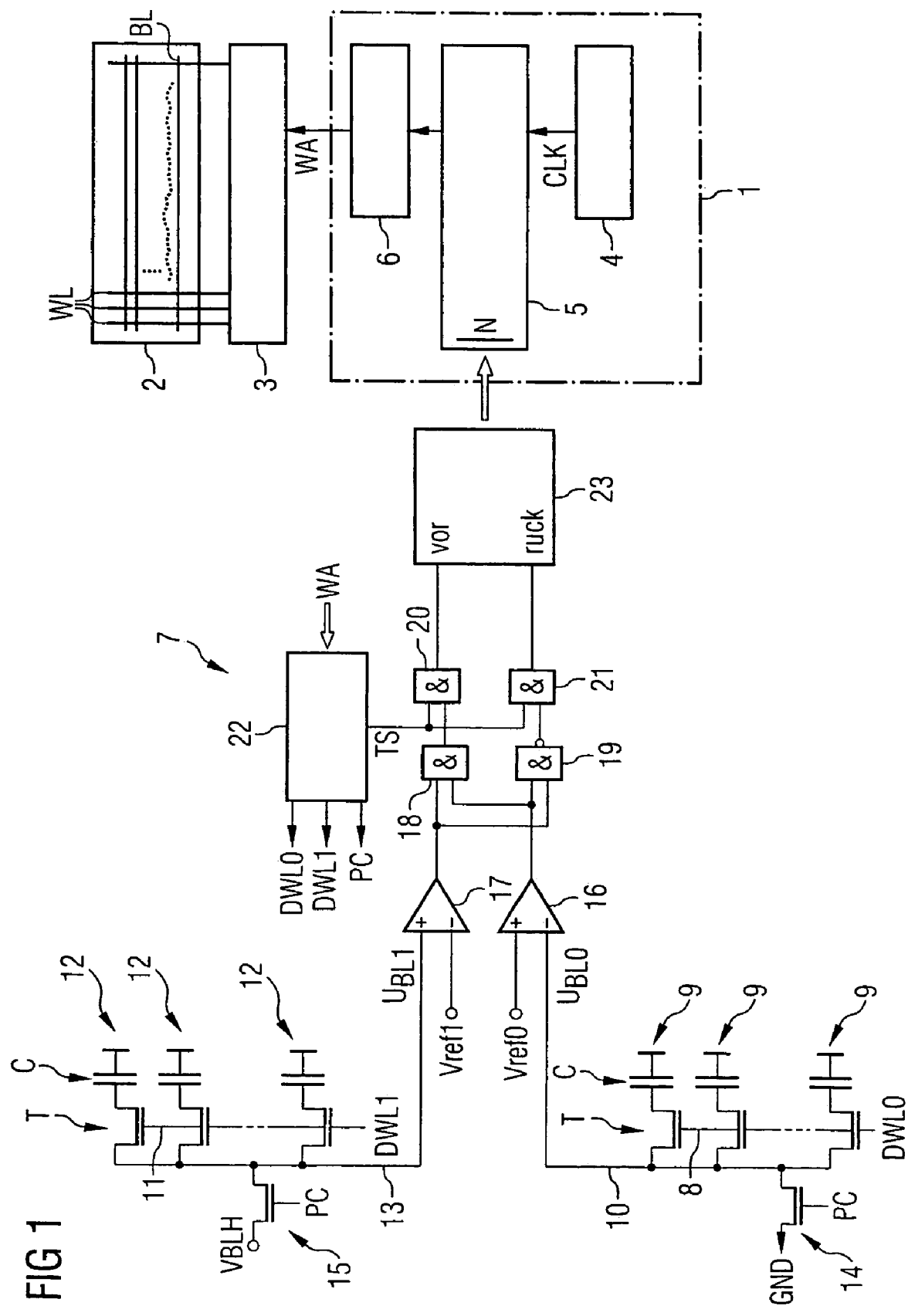
FIG. 1 shows a block diagram in accordance with a preferred embodiment of the present invention.

FIG. 1 illustrates a refresh circuit 1 for refreshing dynamic memory cells in a memory cell array 2. Dynamic memory cells are arranged along word lines WL and bit lines BL and have to be refreshed at regular time intervals in order that the information stored in them is not lost. Dynamic memory cells are refreshed by the activation of the respective word line, so that the charge information flows from a storage capacitance onto the respective bit line. With the aid of sense amplifiers (not shown) a charge difference between the bit line BL and an adjacent bit line BL, said charge difference being brought about by the charge information, is detected and amplified, so that the charge information is written back again to the memory cell, which is still connected via the activated word line WL. Afterward, the relevant word line is deactivated and the charge in the memory cell is refreshed.

The selection of the respective word line WL to be activated is carried out in an address decoder 3, to which word line addresses WA generated by the refresh circuit 1 are successively applied. The word line addresses WA are essentially counted up periodically, within a refresh period essentially corresponding to the time duration required for running through all the word line addresses WA with the aid of the refresh signal. The refresh period thus specifies the frequency with which each of the memory cells on a word line is cyclically refreshed.

The refresh circuit has an oscillator 4, which makes a fundamental frequency available. The fundamental frequency of the oscillator 4 is divided in accordance with a prescribed divider factor in a frequency divider 5 and the resulting refresh signal is made available to a refresh address counter 6. The refresh address counter 6 generates the word line address WA for the memory cells provided for refreshing on a specific word line. The time duration of the refresh period can be altered by prescribing the divider factor for the frequency divider 5.

A regulating circuit 7 is provided for setting the divider factor. The regulating circuit 7 has a first dummy word line 8, on which first dummy memory cells 9 are arranged. The first dummy memory cells 9 each have a storage capacitor C and a selection transistor T. The control inputs of the selection transistors T are connected to the first dummy word line 8, so that a first activation signal DWL0 activates the selection transistors T and connects a terminal of the storage capacitors C to a common first bit line 10.

A second dummy word line 11 is provided in the same way, and can drive second dummy memory cells 12. By activation of the second dummy word line 11 with the aid of a second activation signal DWL1, the corresponding selection transistors T of the second dummy memory circuit can be activated, so that the charges of the storage capacitors C of the second dummy memory cells 12 can flow onto a common second bit line 13.

A first terminal of a first precharge transistor 14 is connected to the first bit line 10. A second terminal of the first precharge transistor 14 is connected to the ground potential GND. A precharge signal PC is applied to the control terminal of the first precharge transistor 14, so that the precharge transistor 14 can be activated in accordance with the precharge signal PC in order to apply the ground potential GND to the common first bit line.

A second precharge transistor 15 is provided, the first terminal of which is connected to the second bit line 13. A second terminal of the second precharge transistor 15 is connected to a high precharge potential VBLH. The precharge signal PC is likewise present at a control input of the second precharge transistor 15 and can activate the second precharge transistor 15 in order to apply the high precharge potential to the second bit line 13.

The first common bit line 10 is connected to an inverting input of a first comparator circuit 16. A first reference potential Vref0 is applied to a noninverting input of the first comparator circuit 16.

A second comparator circuit 17 is provided, the second common bit line 13 being applied to the noninverting input of said second comparator circuit. A second reference potential Vref1 is applied to the inverting input of the second comparator circuit 17.

Outputs of the first and second comparator circuits 16, 17 are applied to inputs of a first AND gate 18 and to inputs of a NAND gate 19. The output of the first AND gate 18 is connected to an input of a second AND gate 20. An output of the NAND gate 19 is connected to an input of a third AND gate 21. A gate signal TS generated by a control unit 22 is applied to further inputs of the second AND gate 20 and of the third AND gate 21.

An output of the second AND gate 20 is connected to an up input of a counter 23 and causes the counter to be incremented. An output of the third AND gate 21 is connected to a down input of the counter 23 and causes the counter value to be decremented. The gate signal TS is embodied in the form of a pulse and determines the instant at which the up and down counting of the counter 23 is to be carried out in accordance with the signals present at the outputs of the first AND gate 18 and of the NAND gate 19.

The control unit 22 serves to make the gate signal TS available, in accordance with which the counter 23 is counted up or down. The up and down counting is determined by the outputs of the first AND gate 18 or of the NAND gate 19 or by the outputs of the first and second comparator circuits 16, 17.

The control unit 22 furthermore generates the first and second activation signals DWL0, DWL1 in order to activate the selection transistors T of the first and second dummy memory cells 9, 12. Furthermore, control unit 22 generates the precharge signal PC which is used to activate the precharge transistors 14, 15 in order thus to precharge the common bit lines 10, 13 and the dummy memory cells 9, 12 present thereon to the respective potential, namely the second dummy memory cells to the high precharge potential VBLH and the first dummy memory cells 9 to the ground potential GND. The control unit 22 receives the respective word line addresses WA from the refresh counter 6 as input.

The regulating circuit 7 has the task of evaluating a charge loss through leakage currents in the dummy memory cells. As a result, a counter 23, in which a divider factor for dividing a fundamental frequency is made available, is intended to be set by incrementing or decrementing such that an optimum refresh frequency is chosen, at which no information is lost in the memory cells of the memory cell array 2 and at which the current consumption of the memory circuit is essentially minimized.

Under the control of the control unit 22, therefore, at the beginning of a refresh period, the first dummy memory cells 9 are charged to the ground potential GND and the second dummy memory cells 12 are charged to the high precharge potential VBLH. The charging of the dummy memory cells 9, 12 is effected by activation of the precharge signal PC and by application of the first and second activation signals DWL0, DWL1 to the first and second dummy word lines 8, 11, so that the precharge transistors 14, 15 and the selection transistors T are activated. Afterward, both the precharge transistors 14, 15 and the selection transistors T are turned off, so that the charge remains stored in the storage capacitors C.

After the subsequent refresh period, the selection transistors T are activated, but the precharge transistors 14, 15 are not activated, so that a charge potential determined by the charge of the memory cells is present on the first or second bit line 10, 13 as first or second bit line potential VBL0, VBL1, respectively. In this case, the resulting charges of the first dummy memory cells 9 and of the second dummy memory cells 12, which differ due to different leakage currents, are averaged out in each case. The first bit line potential VBL0—corresponding to the respective charges—on the first bit line 10 is fed to the first comparator circuit 16, where it is compared with a first reference potential Vref0.

If the first dummy memory cells 9 have been charged to the ground potential GND, then after isolation from the first common bit line 10, the charge potentials thereof rise through leakage currents over time and approximate to a center potential which is determined by the memory cell structure and usually lies approximately in the middle between the high precharge potential VBLH and the ground potential GND. In order that the information in the first dummy memory cells 9 can still be interpreted correctly, the charge potentials of the storage capacitors C must be at a sufficient distance from the center potential in order that the information items stored in the first dummy memory cells 9 can still be read out correctly. This requires a specific potential distance between the first bit line potential VBL0 and the center potential. The amount of charge which the first dummy memory cells 9 are permitted to lose without the information thereof being lost is defined by the first reference voltage potential Vref0. The first reference voltage potential Vref0 specifies an upper threshold of a potential at which the voltage of the first common bit line 10 is permitted to be at a maximum upon connection of all the dummy memory cells 9 without the need to shorten the refresh period or increase the refresh frequency.

In an analogous manner, the second dummy memory cells 12 lose their respective stored charge potential during the refresh period. The second bit line potential VBL1 must lie above the center potential by a certain amount in accordance with the second reference voltage value Vref1 after the activation of the respective selection transistors T, so that the stored information items in the remaining memory cells of the memory cell array 2 can still be read out correctly. The second reference voltage potential Vref1 thus specifies a lower threshold of the second bit line potential VBL1 as far as which the potential on the second bit line 13 is permitted to have fallen after a refresh period without the need to increase the refresh frequency.

The outputs of the comparator circuits 16, 17 thus specify whether or not the bit line potentials VBL0, VBL1 reached after the storage capacitors C have been connected onto the respective bit line 10, 13 lie within the ranges prescribed by the reference voltages Vref0, Vref1. If the first bit line potential VBL0 lies between the ground potential and the first reference voltage potential VBL0, and the second bit line potential VBL1 lies between the second reference voltage potential Vref1 and the high precharge potential VBLH, then the counter 23 is increased. As a result, the refresh frequency is reduced and the refresh period is lengthened. If at least one of the two potentials of the bit lines 10, 13 lies between the first and second reference voltage potentials Vref0, Vref1, then the respective first and/or second dummy memory cells 9, 12 have lost too much charge during the refresh period, so that, by reducing the divider factor, the refresh frequency is increased and the refresh period is reduced.

It may optionally be provided that, directly after the precharging of the first or second dummy memory cells 9, 12 and after the deactivation of the respective first or second word line 8, 11 and after the deactivation of the precharge transistors, the respective common bit line 10, 13 is precharged to a prescribed center potential. In other words, by means of a charge equalizing device (not shown), by way of example, the potential of the common bit lines 10, 13 is brought to a center potential before the activation of the selection transistor T. As a result, it is possible to achieve a defined initial state when the dummy memory cells 9, 12 are connected onto the common bit lines 10, 13, so that a bit line potential independent of the likewise varying leakage currents of the common bit lines 10, 13 is achieved when the selection transistors T are switched on again. The measurement of the leakage currents of the memory cell becomes more precise as a result.

In a manner dependent on the respective word line address WA to be refreshed, the control unit 22 generates the first and second activation signals DWL0, DWL1, and also the precharge signal PC. Furthermore, the control unit 22 generates the gate signal TS, which effects a counter pulse in accordance with the outputs of the comparator circuits 16, 17 for up or down counting of the counter 23.

Figure 2:
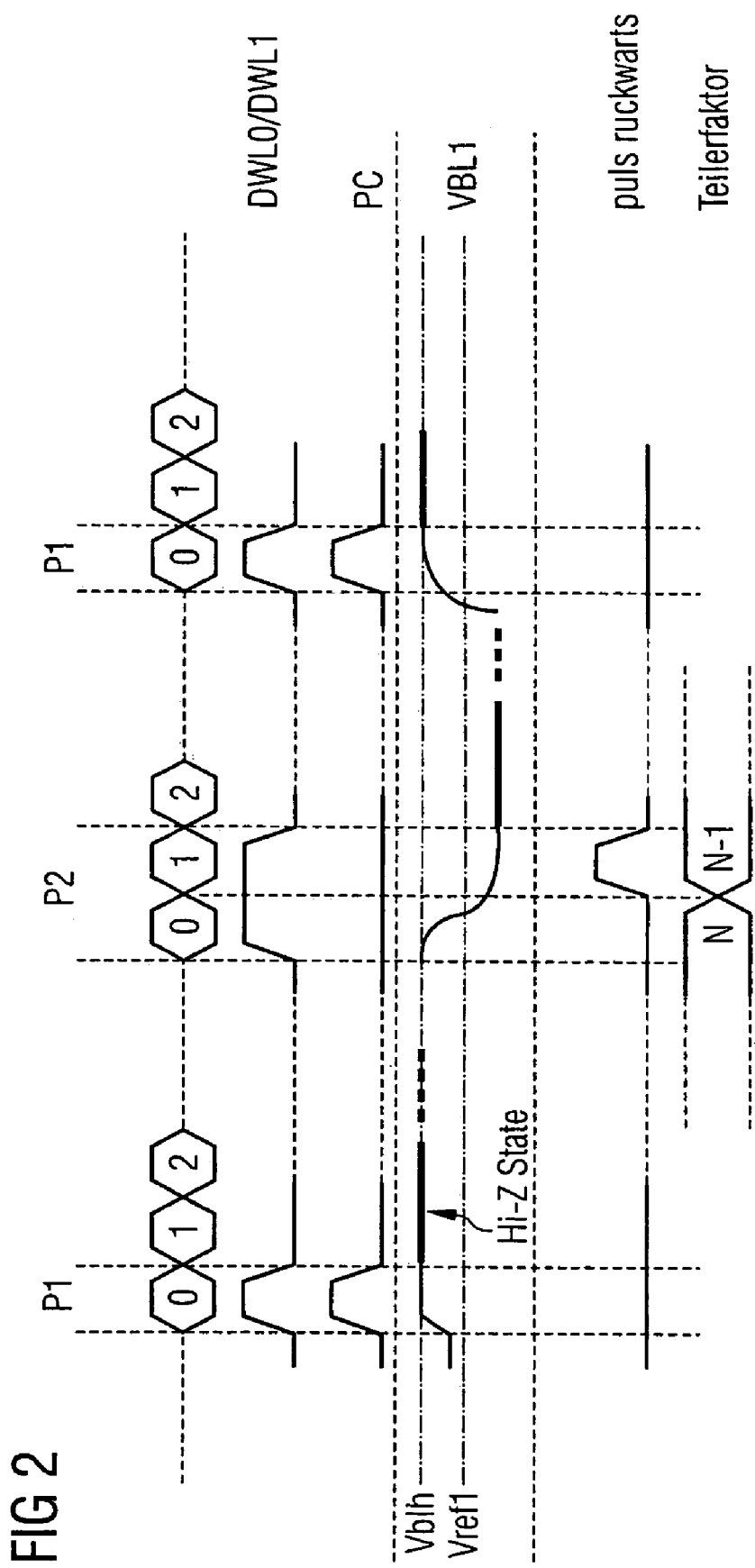
FIG. 2 shows a signal timing diagram for the control signals generated by the control unit.

FIG. 2 shows a signal timing diagram in order to illustrate the control of the corresponding signals by means of the control unit 22. The control unit 22 detects the word line address WA generated by the refresh address counter 6 and determines the set refresh cycle therefrom by comparing the word line address WA with a specific prescribed address value, e.g. address value 0. Each time the refresh address counter 6 reaches the word line address 0, the first and second activation signals DWL0, DWL1 for the activation of the dummy word lines 8, 11 are generated.

When a word line address 0 arrives, there ensues, in a precharge phase P1, the activation both of the activation signals DWL0, DWL1 and of the precharge signal PC., in order to activate the precharge transistors 14, 15. As a result, the first dummy memory cells 9 are charged with the ground potential GND via the activated selection transistors T and the activated first precharge transistor 14. In the same way, the second dummy memory cells 12 are charged to the high precharge potential VBLH via the respective selection transistors T and the second precharge transistor 15. Afterward, i.e. essentially with the arrival of the next higher word line address WA, the precharge signal PC and the first and second activation signals are deactivated, so that the storage capacitors C are isolated from the common bit lines 10, 13.

After a refresh cycle, i.e. after the arrival of the next word line address 0, in a read-out phase P2, the first and second activation signals DWL0, DWL1 are activated again, but without the precharge signal PC being activated. In this way, the respective common bit line 10, 13 is connected to the storage capacitors C of the dummy memory cells 9, 12, said storage capacitors being connected by the activated selection transistors T. The bit line potential VBL0 of the first common bit line 10 is thus determined in accordance with the charges which are stored in the first dummy memory cells 9 and have remained after the refresh period, and the bit line potential VBL1 of the second common bit line 13 is determined by the residual charges of the second dummy memory cells 12.

Only the signal profile with regard to the second common bit line 13 is illustrated below in FIG. 2. It is evident that with the second activation by the second activation signal DWL1, the second bit line potential VBL1 on the second common bit line 13, after the connection of the storage capacitors C, falls from the high precharge potential VBLH to a lower potential. Since, in the example shown, the lower potential lies below the reference voltage value specified by the second reference voltage Vref1, a logic 1 is generated at the output of the NAND gate 19 and is forwarded to the counter 23 as pulse down signal by means of the gate signal TS, which is generated by the control unit 22 essentially in a manner dependent on the next word line address WA, in this case word line address 1.

In the event of the next word line address of 0, the cycle just described begins anew with the precharge phase P1, i.e., with the word line address 0, the first and second dummy memory cells 9, 12 are charged to the ground potential and the high precharge potential VBLH, respectively. The pulse down signal effects decrementing of the divider factor which is stored in the counter 23 and is forwarded to the frequency divider 5, and thus shortens the refresh period. During the next read-out phase P2, the charge loss in the storage capacitors C is therefore lower on account of the shortened refresh period, so that the voltage on the second common bit line 13 falls to a lesser extent upon a second arrival of the word line address 0. If the second bit line potential VBL1 lies above the value prescribed by the second reference voltage potential Vref1, then this does not lead to a down counting of the divider factor in the counter 23, but rather to an up counting. In this way, given a steady-state condition, the divider factor value in the counter 23 essentially swings to and fro and varies around the optimum divider factor value for the respective memory circuit.

Since the refresh circuit 1 also refreshes the memory cells used for information storage, a slight exceeding of the first reference voltage potential Vref0 or undershooting of the second reference voltage potential Vref1 brought about by the increasing or reduction of the divider factor by an increment must not lead to a loss of information in the memory cells. The reference voltage potentials Vref0, Vref1 are thus so far away from the critical potential value, at which the information of the memory cells is still just stored, that the critical voltage value is not reached or exceeded under any circumstances as a result of a change in the divider factor by the prescribed value, preferably 1.

What is claimed is:

1. A method for refreshing dynamic memory cells arranged along word lines and bit lines, comprising:
generating a refresh signal to activate a word line to refresh a charge stored in memory cells arranged on the word line;
monitoring an amount of charge loss of one or more sets of dynamic reference cells; and
adjusting a frequency of the refresh signal based on the monitored amount of charge loss, wherein the frequency of the refresh signal is adjusted by dividing a fundamental frequency by a frequency divider value, wherein adjusting the frequency of the refresh signal comprises adjusting the frequency divider value, and wherein adjusting the frequency divider value comprises:

increasing the frequency divider value if the monitored amount of charge loss falls below a first threshold value; and decreasing the frequency divider value if the monitored amount of charge loss exceeds a second threshold value.

2. The method of claim 1, wherein the first and second threshold values are different.

3. The method of claim 1, wherein monitoring the amount of charge loss of the one or more sets of reference cells comprises:

precharging a first set of the reference cells on a first reference word line to a first potential value;

isolating the first set of reference cells from a first common bit line;

a known time later, connecting the first set of reference cells to the first common bit line; and comparing a potential on the first common bit line with a first reference potential.

4. The method of claim 3, further comprising precharging the first common bit line to a center potential.

5. The method of claim 3, wherein the first reference potential is a ground reference.

6. The method of claim 3, further comprising:

precharging a second set of the reference cells on a second reference word line to a second potential value;

isolating the second set of reference cells from a second common bit line;

a known time later, connecting the second set of reference cells to the second common bit line; and comparing a potential on the second common bit line with a second reference potential.

7. The method of claim 6, wherein adjusting the frequency of the refresh signal based on the monitored amount of charge loss comprises:

increasing the frequency of the refresh signal if the potential on the first common bit line exceeds the first reference potential or the second reference potential exceeds the potential on the second common bit line; and decreasing the frequency of the refresh signal if the first reference potential exceeds the potential on the first common bit line and the potential on the second common bit line exceeds the second reference potential.

8. A circuit for adjusting a frequency of a refresh signal used to refresh dynamic memory cells, comprising:

a first set of reference cells connectable to a first common bit line by activation of a first common word line;

a second set of reference cells connectable to a second common bit line by activation of a second common word line; and a regulating unit comprising a frequency divider circuit and a counter for storing a frequency divider value for controlling the frequency divider circuit, the regulating unit configured to monitor an amount of charge loss of the first and second reference cells and adjust the frequency of the refresh signal used to refresh the dynamic memory cells based on the monitored amount of charge loss, wherein the frequency of the refresh signal is adjusted by dividing a fundamental frequency by the frequency divider value.

9. The circuit of claim 8, wherein the regulating unit is configured to generate one or more control signals to activate the first and second sets of reference cells in order to monitor the amount of charge loss of the first and second reference cells.

10. The circuit of claim 8, wherein the regulating unit is configured to:

increase the frequency of the refresh signal if the loss of charge of either the first and second sets of reference cells exceeds a threshold amount; and decrease the frequency of the refresh signal if the loss of charge of both the first and second sets of reference cells does not exceed the threshold amount.

11. The circuit of claim 8, wherein the regulating circuit is configured to:

precharge the first and second sets of reference cells to respective first and second potential values;

isolate the first and sets of reference cells from the respective first and second common bit lines;

a known time later, connect the first and second sets of reference cells to the respective first and second common bit lines;

determine the charge loss of the first set of reference cells by comparing a potential on the first common bit line with a first reference potential; and determine the charge loss of the second set of reference cells by comparing a potential on the second common bit line with a second reference potential.

12. The circuit of claim 11, wherein:

the first potential value is ground;

the second potential value is above ground;

the regulating unit is configured to increase the frequency of the refresh signal if the potential on the first common bit line exceeds the first reference potential, the second reference potential exceeds the potential on the second common bit line, or both; and the regulating unit is configured to decrease the frequency of the refresh signal if the first reference potential exceeds the potential on the first common bit line and the potential on the second common bit line exceeds the second reference potential.

13. The circuit of claim 11, wherein the regulating circuit is configured to precharge the first and second common bit lines to a center potential prior to connecting the first and second sets of reference cells to the respective first and second common bit lines.

14. The circuit of claim 8, wherein the regulating unit initiates the monitoring of charge loss of the first and second sets of reference cells and the adjusting of the frequency of the refresh signal based on one or more word address signals received from a refresh circuit.

15. A memory device, comprising:

a plurality of dynamic memory cells arranged along word lines and bit lines of the device;

at least a first set of reference cells arranged around a first common word line and a first common bit line;

a refresh circuit for generating a refresh signal to refresh the dynamic memory cells; and a refresh frequency adjust circuit to adjust a frequency of the refresh signal based on a monitored amount of charge loss of the first set of reference cells, wherein the frequency of the refresh signal is adjusted by dividing a fundamental frequency by a frequency divider value, wherein:

the frequency of the refresh signal is established by dividing the fundamental frequency of an oscillator circuit by a counter value, the counter value being the frequency divider value; and the refresh frequency adjust circuit is configured to adjust the frequency of the refresh signal by adjusting the counter value.

16. The memory device of claim 15, further composing:

at least a second set of reference cells arranged around a second common word line and a second common bit line; and wherein the refresh frequency adjust circuit is configured to adjust the frequency of the refresh signal based on a monitored amount of charge loss of both the first and second sets of reference cells.

17. A circuit for adjusting a frequency of a refresh signal used to refresh dynamic memory cells, comprising:

a first set of reference cells connectable to a first common bit line by activation of a first common word line;

an oscillator configured to output a clock signal at a fundamental frequency;

a regulating circuit configured to:
monitor an amount of charge loss of the first reference cells; and
set a divider value on the basis of the amount of charge loss, wherein regulating circuit is configured to:
increase the divider value if the monitored amount of charge loss falls below a first threshold value; and
decrease the divider value if the monitored amount of charge loss exceeds a second threshold value;

a frequency divider circuit configured to divide the clock signal at the fundamental frequency by the divider value, thereby producing the refresh signal at an adjusted frequency; and a counter configured to store the divider value.

18. The circuit of claim 17, further comprising:

a second set of reference cells arranged around a second common word line and a second common bit line; and wherein the regulating circuit is further configured to adjust the divider value based on a monitored amount of charge loss of both the first and second sets of reference cells.

19. The circuit of claim 18, wherein the regulating circuit is further configured to:

precharge the first and second sets of reference cells to respective first and second potential values;

isolate the first and sets of reference cells from the respective first and second common bit lines;

connect, after a predetermined delay time, the first and second sets of reference cells to the respective first and second common bit lines;

determine the charge loss of the first set of reference cells by comparing a potential on the first common bit line with a first reference potential; and determine the charge loss of the second set of reference cells by comparing a potential on the second common bit line with a second reference potential.

* * * * *